United States Patent [19]

Kaplow et al.

[11] E Re. 30,384

[45] Reissued Aug. 26, 1980

[54] SOLAR CELL

[75] Inventors: Roy Kaplow, Newton; Robert I. Frank, Lexington, both of Mass.

[73] Assignee: Massachusetts Institute of Technology, Cambridge, Mass.

[21] Appl. No.: 33,992

[22] Filed: Apr. 27, 1979

Related U.S. Patent Documents

Reissue of:

[64] Patent No.: 4,128,732
Issued: Dec. 5, 1978
Appl. No.: 871,496
Filed: Jan. 23, 1978

U.S. Applications:

[63] Continuation-in-part of Ser. No. 824,974, Aug. 15, 1977, abandoned.

[51] Int. Cl.[2] ..... H01L 31/06

[52] U.S. Cl. ..... 136/89 PC; 136/89 MS; 357/20; 357/30; 357/55

[58] Field of Search ..... 136/89 PC, 89 MS; 357/30, 55, 20

[56] References Cited

U.S. PATENT DOCUMENTS

| | | | |
|---|---|---|---|
| 3,015,762 | 1/1962 | Shockley | 357/20 |
| 3,936,319 | 2/1976 | Anthony et al. | 136/89 |
| 3,948,682 | 4/1976 | Bordina et al. | 136/89 |
| 3,969,746 | 7/1976 | Kendall et al. | 357/30 |
| 3,985,579 | 10/1976 | Rahilly | 136/89 |
| 3,994,012 | 11/1976 | Warner, Jr. | 357/30 |
| 4,042,417 | 8/1977 | Kaplow et al. | 136/89 PC |

*Primary Examiner*—Aaron Weisstuch
*Attorney, Agent, or Firm*—Hopgood, Calimafde, Kalil, Blaustein & Lieberman

[57] ABSTRACT

An improved solar cell designed for optimum efficiency is comprised of a plurality of series connected unit solar cells formed from a common substrate of semiconductor material. Each unit solar cell has spaced elongate sidewalls, and a "dead space" area between adjoining sidewalls of adjacent units is made substantially smaller than an active, light receiving area, extending between the opposite sidewalls of each individual unit. In addition, the width of the active area is concisely limited to ensure that radiation incident on the active area is incident at a point which is spaced from the p-n junction of each unit by no more than a predetermined optimum distance. Reducing the "dead space" area while concisely limiting the width of the active area provides improved solar cell performance without requiring focusing lenses.

38 Claims, 9 Drawing Figures

SOLAR CELL

Matter enclosed in heavy brackets [ ] appears in the original patent but forms no part of this reissue specification; matter printed in italics indicates the additions made by reissue.

This application is a continuation-in-part of our copending application Ser. No. 824,974, filed Aug. 15, 1977 (now abandoned).

This invention relates to solar or photovoltaic cells and more particularly to an improved solar cell uniquely designed for optimum efficiency.

Fossil fuels have in the past provided the bulk of the world's energy needs. However, as the price of fossil fuels has increased and their supply decreased, increasing attention has been directed toward the development of alternate energy sources. One such alternate energy source is the solar cell, which directly converts the energy from the sun into usable electrical power.

Solar cells have been long used in prior-art solar-energy systems. In these systems, the typical solar cell consists of a large area p-n junction formed in a wafer of monocrystalline material such as silicon. The junction is formed parallel to the upper surface of the cell, and this upper surface receives incident radiation from the sun, to produce current flow across the p-n junction in a well-known manner. These conventional solar cells suffer from many disadvantages. Such disadvantages have been well documented and include large series resistance, inefficient operation at high concentrations of incident light, and the need for a contact grid which is formed on the upper surface of the cell, thereby reducing the cell area available to receive incident radiation.

Vertical-junction solar cells have been developed in an attempt to circumvent the various problems encountered with conventional solar cells. One type of vertical-junction solar cell is fabricated from stacks of silicon wafers which have been appropriately doped to form p+ and n+ surface layers on opposite sides of the wafers and the wafers are then stacked and sintered together. The wafers are sliced into segments to create a plurality of solar cells with p-n junctions normal to the cell surface. With silicon, the resultant vertical-junction solar cell has the potential for more efficient high-intensity operation, does not require the contact grid and also provides low series resistance. However, these cells, as they have been commercially available, typically have a measured efficiency of only 8% at one sun.

Our application, Ser. No. 690,056, filed May 26, 1976 (now U.S. Pat. No. 4,042,417), and entitled "Photovoltaic System Including A Lens Structure", discloses a technique for achieving greater efficiency in such vertical junction solar cells. This technique includes the use of a cylindrical lens which focuses the solar radiation into a narrow beam incident on the active, light-receiving area of the solar cell at an optimum region, adjacent to, but offset from the vertical junction plane. This focusing technique achieves approximately a 2:1 improvement in solar-cell efficiency. Improvement results because incident radiation is not lost on the "dead space" of the cell's p-n junction which consists of the p+,n+ regions and the electrode therebetween, and because incident radiation is focused at an optimum region near the p-n junction. Focusing incident radiation at this optimum region rather than further away from the junction creates carriers with a greater probability of being collected than carriers created at a point further away from the junction. Notwithstanding the dramatic improvement in cell efficiency achieved by this invention, such improvement required the utilization of a lens array which increased cost and decreased reliability due to the problem of lens degradation over a long period of time.

A further improvement in the area of solar-cell fabrication is disclosed in our copending application, Ser. No. 689,989, filed May 26, 1976, and entitled "High-Intensity Solid State Solar Cell" *now U.S. Letters Pat. No. 4,110,122, issued Aug. 29, 1978.* In this invention, a plurality of solar-cell units are fabricated from a common substrate, and the body material of each unit advantageously has the same positional relation in the finished cell as existed in the original substrate. This technique provides solar-cell units having identical characteristics as to material, orientation and physical properties, as well as units having a predetermined fixed positional relation to each other, thereby increasing the accuracy of focusing arrangements. Again, however, the solar cell of this invention requires a focusing lens for optimum performance.

It is therefore, an object of this invention to achieve improved solar-cell performance without requiring special focusing by lenses or other means.

It is another object of this invention to provide solar-cell units having identical physical characteristics, and efficient operation when connected in series.

It is a further object of this invention to provide an improved solar cell which operates at high incident light intensity.

It is a further object of this invention to provide an improved solar cell having greatly reduced "dead space" when compared to prior-art vertical-junction solar cells.

It is a further object of this invention to provide an improved solar cell in which the ratio of "dead space" in the cell to active area in the cell is greatly reduced.

It is another object of this invention to concisely match the dimensions of the cell units and the carrier diffusion lengths to thereby achieve high collection efficiency.

It is a further and general object of this invention to provide a solar cell which will provide relatively large amounts of electrical energy without requiring focusing lenses of the character indicated.

A still further object is to provide an improved array of solar-cell units presenting an overall exposure area upon which solar energy may be concentrated in the order of at least 100 suns, to produce an electrical output at relatively great efficiency.

In accordance with the invention individual solar-cell units are formed from a common substrate, and the body material of each of the units formed from the substrate advantageously has the same space relation to the body material of each of the other units as existed in the original substrate. Each unit has spaced elongate sidewalls, and the "dead space" area between adjoining sidewalls of adjacent cells is made substantially smaller than the active area between the opposite sidewalls of each individual unit. Moreover, the distance between the opposite sidewalls of each unit (i.e., the width of the active area) is concisely limited to a predetermined optimum distance (related to minority-carrier diffusion length, including surface-recombination effects) such that radiation incident at any point on the active area is incident at a point spaced from at least one of the unit sidewalls by no more than the predetermined optimum [distnace] *distance*. Limiting the width of the active area in this manner ensures that light is always incident at a point near the p-n junction to thereby create carriers with a high probability of being collected. Reducing the "dead space" area while correctly choosing the width of the active area provides improved cell performance without requiring focusing lenses.

To the accomplishment of the above and to further objects that may hereinafter appear the present invention relates to an improved solar cell as defined in the appended claims and as described in the following specification when considered in conjunction with the accompanying drawings, in which:

The embodiments of the invention described hereinbelow involve a solar cell which has an n-type silicon substrate. It is to be understood, however, that the solar cell of the invention may also be implemented with a substrate of p-type polarity, in which case the polarity of the other regions in the cell would be reversed, with n replaced by p, n+ replaced by p+ and so on. It will also be understood that other types of semiconductor material may also be employed and, that a heterojunction, as well as the homojunction structure described may be employed.

Figure 1:
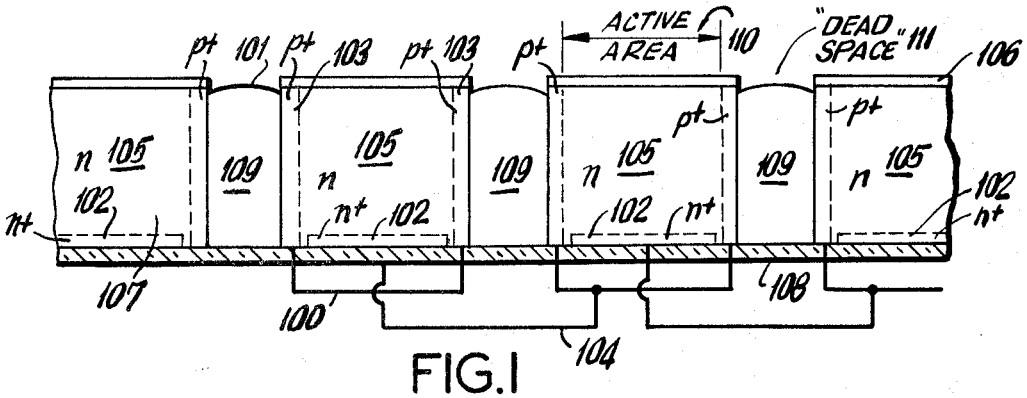
FIG. 1 is a schematic diagram as viewed in cross section of a multiple-unit fragment of a solar-cell array previously designed by the instant inventors.

Before turning to a detailed description of the invention, it is helpful in achieving a greater understanding of the invention's unique advantages to describe the solar cell shown in FIG. 1. FIG. 1 illustrates a solar-cell arrangement which is one particular embodiment of a solid-state solar cell described in our said copending application Ser. No. 689,989. More particularly, the solar cell illustrated in FIG. 1 consists of a series of individual unit solar cells 105, each of which is formed from the same single wafer of semiconductor material, the units being subsequently connected in series, or in series-connected subunits which are later connected in parallel.

Each of the unit solar cells 105, illustrated in FIG. 1, is comprised of an n-type substrate 107. The unit solar cells 105 are separated from one another by grooves 101 which are formed by anisotropic etching to create grooves having straight parallel walls extending completely through the common substrate. P+ regions 103 are formed along the wall of each groove and an n+ region 102 is formed along the lower surface of each unit cell. An oxide layer 108 is formed on the lower surface of each cell, and a passivation and anti-reflective coating 106 may be formed on the upper surface of each cell. The grooves may be subsequently filled with an insulating material 109 which may be epoxy, glass or other suitable insulating material to achieve electrical isolation between the cell units. Alternatively, the grooves may be left partially or completely open, with other means being provided for structural support and maintenance of subunit alignment. Cell construction in a series-connected group of units in an array is completed by interconnecting the p+ regions of each cell with a first connection schematically indicated at 100, the n+ region of each cell being connected to the p+ regions of the next-adjacent cell via a second connection, schematically indicated at 104. Series-parallel combination connections of unit groups with the array are also possible; such constructions are the subject of another of our applications, and are not necessary to a description of the present invention.

Light is incident on the active region 110 of each cell, and the active region is defined as the area of the substrate surface available to receive incident radiation. The incident light causes a flow of carriers across the p-n junction formed by the p+ regions and substrate, to the n+ regions, and from the latter to the p+ regions in succeeding solar cells via connection 104. The conduction of current proceeds in series across the individual solar cells to a current collector (not shown). The connections indicated schematically in FIG. 1 are, of course, illustrations of actual connections between adjacent cells wherein such actual connections may be formed by known selective etching and metalization techniques, or other microelectronic techniques.

The solar cell shown in FIG. 1, although providing a marked improvement over prior-art solar cells, requires a special focusing arrangement to operate [a] *at* maximum efficiency. Such a focusing lens arrangement is described in our said application Ser. No. 690,056. This lens arrangement includes a plurality of lens elements which focus the incoming radiation into a plurality of narrow beams which are directed to be incident on the upper surface of the cell at a location adjacent to, but offset from the plane of each p-n junction. Such a focusing arrangement improves cell performance for two reasons. First, incident radiation is not lost on the large "dead space" area 111 indicated in FIG. 1 which contributes essentially nothing to cell output. As indicated, this area is comprised of the adjoining p+ regions of adjacent cells and the material therebetween. Second, incident radiation is not directed to just any point on the active area 110 but rather the incident radiation is directed to an optimum region on the active area which is at least generally adjacent to but offset from the plane of the p-n junction. Directing the incident radiation to this optimum point improves cell performance because the radiation focused at that point (or closer to the junction) creates carriers with a much higher probability of being collected than carriers created at a location which is further from the junction.

Extensive investigation by the instant inventors has determined where this optimum point should lie on the active area in order to achieve maximum performance in a silicon vertical junction solar cell. The result of these investigations has been reported in an article entitled "Improved Performance of Solar Cells for High Intensity Application", published in "The Conference Record of the Twelfth IEEE Photovoltaic Specialists Conference", held Nov. 15–18, 1976. As reported in this article, the instant inventors were concerned with the nature of the response of vertical-junction solar cells to focused incident light. Accordingly an array of vertical-junction solar cells was obtained from Semicon, Inc. of Burlington, Massachusetts. Contacts were made to electrodes on either side of an individual cell, and the cell array was mounted on a micrometer stage. A light spot, provided by focusing the beam from a He-Ne laser, and having a diameter of approximately 1 to 2 mils was directed normal to the upper surface of the array, and the micrometer stage was moved in 0.5-mil increments to effectively scan the focused laser beam across the selected individual cell. The short-circuit cell current $I_{sc}$ was measured for each location of the incident spot using an external variable load resistor for the measurements.

Figure 6:
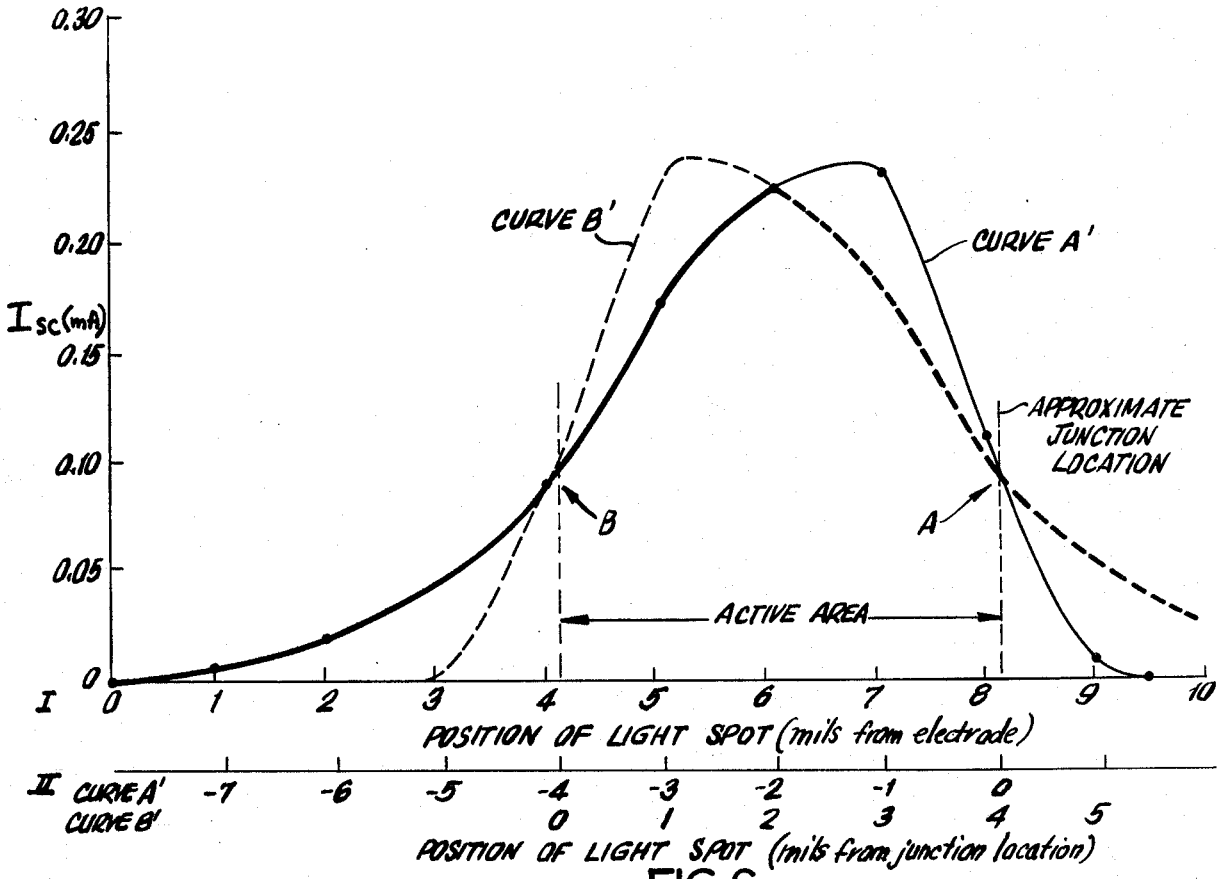
FIG. 6 is a plot of the short-circuit current response of one particular vertical-junction solar-cell unit of the array of FIG. 4.

The solid curve A' shown in FIG. 6 is a plot of the measured short-circuit current output, $I_{sc}$ in milliamperes, versus traverse position of the light spot, in mils from the electrode (horizontal axis I). This curve illustrates that cell output $I_{sc}$ is much greater in the n region adjacent to but offset from the p-n junction, whose approximate location is shown by legend at dotted line A. More particularly, the solid-line plot in FIG. 6 illustrates that cell performance shows a marked increase when light is incident 1 to 2 mils from the p-n junction.

The decrease in $I_{sc}$ shown by the solid-line plot in FIG. 6, near the junction location at A, but within the n type region to the left of A, is attributable to the use of a 1 to 2 mil diameter light spot to scan the cell surface. A light spot of such diameter will extend into the "dead space" area between adjacent cells as it nears the junction location. The result is a "vignetting" effect, in that only a portion of the light spot is incident on the active area of the cell when the light spot is near the junction location, thereby causing a reduction in the value of $I_{sc}$. It will be understood, of course, that if a light spot of infinitesimal diameter could be used, the solid-line plot of FIG. 6 would not fall off as rapidly as shown in FIG. 6, but rather $I_{sc}$ would remain at or near its maximum value until the [infinitessimal-diameter] *infinitesimal-diameter* light spot were much closer to the junction location. As the use of an infinitesimal-diameter light spot is experimentally impossible, the plot in FIG. 6 is offered as practical experimental proof that $I_{sc}$ does show a marked increase approximately 1 to 2 mils from the junction location. Also, the use of a lens array (per said application Ser. No. 690,056) produces a focused beam having an approximate width of 1 to 2 mils and, therefore, the use of a light spot of 1 to 2 mils diameter represents a realistically attainable situation.

It should also be understood that the optimum unit-cell width is dependent on the minority-carrier diffusion length of the base material. A base material having different minority-carrier diffusion lengths would change this distance accordingly, as would processing the base material to improve the carrier-diffusion length. Generally speaking, it is desirable that the maximum distance that a carrier must travel to reach and be collected at the p-n junction shall be less than the minority-carrier diffusion length. For the sample used in connection with FIG. 6, the diffusion length (including surface-recombination effects) was in the order of 1 to 2 mils.

Based on the foregoing, it can be seen that improved solar cell performance can be achieved without the use of focusing lenses (a) if the "dead space" area can be drastically reduced and, moreover, (b) if substantially all of the light falling on the active area can be incident at a point which is no more than 1 to 2 mils from the p-n junction. The 1 to 2 mils distance is optimum for this particular base material and, of course, this distance would vary depending on the properties of the base material used. The following description focuses on an improved solar cell which advantageously provides the two elements, (a) and (b), defined above which are necessary for improved solar-cell performance.

Figure 2:
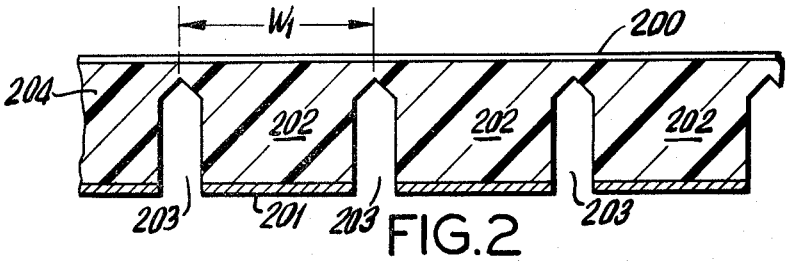
FIG. 2 is a similar sectional view of a substrate showing a first wide groove cut into the substrate as a first procedure in the construction of an improved solar cell of the present invention.

Turning now to a description of the invention, there is illustrated in FIG. 2 a common n-type silicon substrate 204 from which will be created a plurality of individual unit solar cells. These unit cells are all created from common substrate 204, and thus the body material of each cell unit will advantageously have the same physical properties and crystallographic orientation in the finished cell structure as existed in the original substrate. This technique provides solar cell units having identical characteristics as to material, orientation and physical properties, a feature which is particularly important for series-connected cell units. A procedure for fabricating cells from a common substrate has been described in detail in our copending application, Ser. No. 689,989 and Ser. No. 796,657 *now U.S. Letters Pat. Nos. 4,110,122, issued Aug. 29, 1978 and 4,131,984, issued Jan. 2, 1979, respectively*; said Ser. No. 796,657 being a continuation-in-part of said Ser. No. 689,989. Therefore, the details of fabrication will not be repeated here, but it is understood that fabrication techniques described in these copending applications may be utilized in fabrication of the improved solar cell of the instant invention.

Referring to FIG. 2, it can be seen that into substrate 204 there has been etched a plurality of grooves 203. Grooves 203 are not etched completely through substrate 204 as was done in FIG. 1, but rather are etched from the lower surface of the substrate to a point close to but short of the upper surface of the substrate. Note that the top of each groove is wedge-shaped, rather than flat. This wedge-shaped groove, along with the vertical sidewalls, is a property of anisotropic etching of silicon having a <110> surface orientation; of course, other shaped groove bottoms may result, depending upon the properties of the particular type of etchant used. If the etching for the grooves were continued all the way through the silicon substrate the resultant structure would appear identical to the structure shown in FIG. 1 with the grooves completely cutting through the substrate.

Grooves 203 partially define individual n-type substrate units 202 which are to be formed into completed solar-cell units. The grooves can, of course, be etched into the substrate at any desired interval to form the individual units. The particular interval chosen is indicated as $W_1$ in FIG. 2, and as will be hereinafter described, $W_1$ approximately equals between 2 and 4 mils, or other specific dimensions consistent with the minority-carrier diffusion length. Formed on the upper surface of the substrate in FIG. 2 is an anti-reflective coating 200 and formed on the lower surface is an oxide layer 201.

Figure 3:
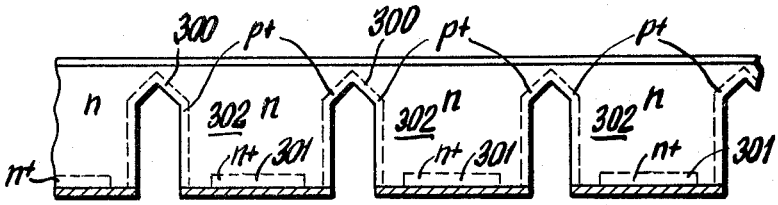
FIGS. 3 and 4 are further sectional views of the substrate of FIG. 2, showing (in FIG. 3) p+ and n+ regions diffused into the substrate, and showing (in FIG. 4) a final narrow groove cut into the substrate to form a completed improved solar cell.

Subsequent to groove formation, p regions are formed along the walls of each groove by diffusion, as is indicated in FIG. 3 at 300. These p diffusions follow the groove contours, thereby forming a p-n junction completely around each groove between the p region and the n-type substrate. N regions are also formed along the lower surface of each unit solar cell at 301, in the same manner as described for the case of FIG. 1. Subsequent to the diffusion process, a plurality of unit solar cells 302 exist in the substrate, requiring only final separation and interconnection to form completed individual cell units.

Figure 4:
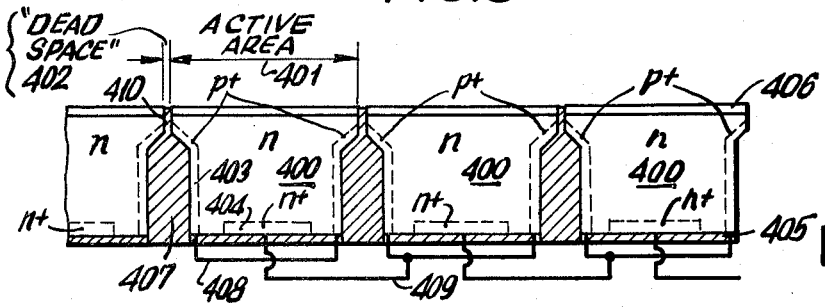

FIG. 4 shows the completed improved solar cell. Separation of each unit solar cell has been achieved with the formation of very narrow grooves 410. These narrow grooves are advantageously etched from the upper surface of the substrate to intersect the much wider grooves 407 which were etched from the lower surface of the substrate. Cell separation, therefore, is achieved with a two-step etching process. A first wide groove is etched from the bottom of the substrate to a point close to, but short of the upper surface of the substrate. A second, substantially narrower groove is then etched from the top of the substrate to intersect and thus open the much wider groove. Alternatively, of course, the order of etching the narrow and wide grooves could be reversed or both grooves might be etched concurrently. It is, of course, understood that etching a single narrow groove through the substrate would be extremely difficult in this situation, in that the width to depth ratio for a narrow groove would be typically in the order of 60:1 for two-step etching, or 30:1 for two-sided simultaneous etching, it being understood that the ratio could be much higher the thicker the substrate used.

Cell construction is completed by filling the wide and narrow grooves with an insulating material to provide electrical isolation of the cells; alternatively, the grooves may be left partially or completely open, with other means being provided for structural support and maintenance of subunit alignment. The insulating material is indicated by shading within the groove regions 407 and 410. Interconnection of the various cells is achieved by interconnecting the p regions 403 of each unit cell, using a first connection schematically indicated at 408, and by connecting the n region 404 of each cell to the p regions of the next-adjacent cell, using the connection schematically indicated at 409; and as noted above, it should be recognized that series-parallel combination connections can alternatively be made. However, regardless of the interconnection of cell units, the flow of carriers through each subunit in response to incident light, is as ordinarily understood for p+, n, n+ silicon cells. To complete the description of FIG. 4, the antireflection coating and the oxide layer previously described above are indicated at 406 and 405, respectively.

It will be understood that the connections shown schematically in FIG. 4 can be made by selective etching and metalization techniques well known in the art. The remaining portions of the unit solar cells may be fabricated by known diffusion, anisotropic etching, thermal oxidation, vacuum deposition, chemical vapor deposition, photolithographic and other techniques, such as those used in the field of microelectronics and which are accordingly not otherwise disclosed herein.

The unit solar cells 400 of FIG. 4 will be seen to be generally similar to the unit solar cells 105 described in connection with FIG. 1. However, each unit solar cell now has a very small "dead space" area 402 in comparison to the active area 401. This ratio of "dead space" area to active area is much smaller than the ratio of "dead space" area to active area in FIG. 1, due to the formation of each cell with a large groove etched from the lower surface of the substrate and a very small groove etched from the upper surface of the substrate. Moreover, the "dead space" area on the upper surface of each cell is further reduced because it is now comprised of only the narrow grooves (which may be filled with insulating material) and does not include the p+ diffused area of the junction itself. Rather the p-n junction is "buried" beneath the light incident surface, thereby increasing the active area of the cell. What has been achieved therefore is a dramatic reduction in the "dead space" area with a corresponding decrease in the ratio of "dead space" area to active area. This reduction of the "dead space" area results in a direct and immediate improvement in solar cell performance by reducing the losses due to incident radiation falling on the "dead space" area, and such improvement is achieved without the use of focusing lenses.

Figure 5:
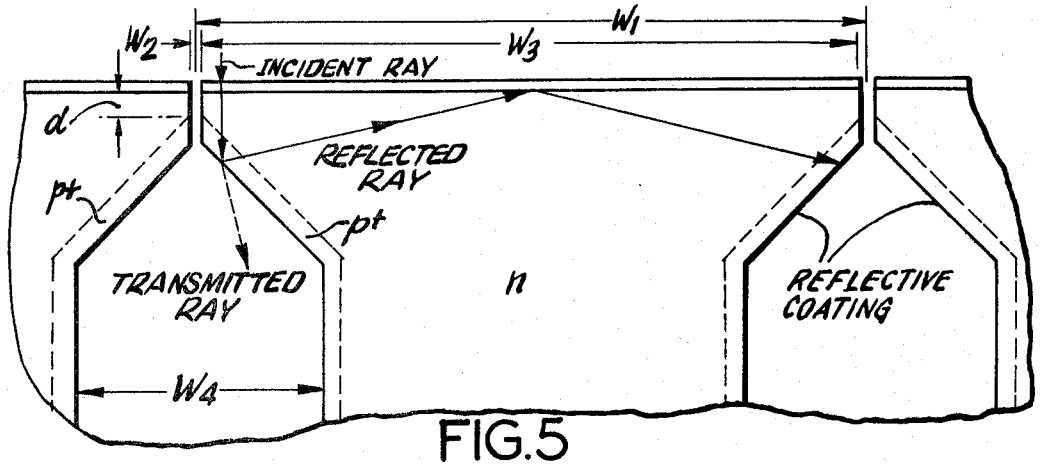
FIG. 5 is an enlarged sectional view of one area of the improved solar cell.

FIG. 5 provides an expanded view of the large and narrow grooves which separate the individual solar cells of FIG. 4. As is shown therein, the buried p-n junction lies at a distance "d" beneath the light incident surface of the solar cell. Since about 80 percent of the absorbable portion of the incident sunlight is absorbed within 1 mil of the surface of the cell (for the assumed case of silicon), "d", is advantageously chosen to be in the range of 1 mil.

FIG. 5 also illustrates the path of a light ray incident on the upper surface of the solar cell. As is shown therein, the incident ray penetrates into the solar cell and when striking the groove boundary is partially reflected back into the base material and partially transmitted into the wider groove area. The light lost due to the transmission into the wider groove can be shown to be on the order of several percent or less of the total light incident on the upper surface of the cell. This is to be compared with the amount of light that would be lost into the much larger "dead space" area that would result if the wide grooves had been etched all the way through the substrate as indicated in FIG. 1. By inspection, it can be seen that light loss from such a large "dead space" area would be much larger than the light loss resulting from transmission into the wide groove illustrated in FIG. 5. In addition, even that small loss can be further reduced by metallizing or otherwise coating the sloping walls of the grooves, the latter being suggested by legend in FIG. 5.

From the preceding discussion, it will be recalled that light incident at a point adjacent to but offset from the p-n junction results in improved solar-cell performance, due to the generation of carriers with a greater probability of being collected than carriers generated at a point more distant from the p-n junction. This point of optimum light incidence beyond which cell response drastically decreases has been experimentally determined to lie no more than 1 to 2 mils from the p-n junction for the particular case illustrated in FIG. 6. With this experimental determination in mind, the distance $W_3$ between opposite sidewalls of each individual solar-cell unit (i.e., the width of the active area) is advantageously chosen to be between 2 and 4 mils. Placing $W_3$ in this range results in the midpoint of each active area being no more than 1 to 2 mils (the maximum acceptable distance from the junction for incident light) from the adjacent sidewalls of the unit solar cell and thus from the adjacent p-n junction. Therefore, all light incident at approximately the midpoint of the active area is incident at a point experimentally determined to be suitable for good solar-cell performance. Moreover, referring to FIG. 6, it can be seen that light incident on the solar cell surface at points closer to the p-n junction will result in improved solar cell performance when compared with light incident at locations more remote from the p-n junction. From the foregoing, therefore, it can be seen that solar-cell performance is readily improved without the use of special unit-focusing lenses by properly choosing the width of the active area. An active area having a width of between 2 and 4 mils (for a material like that shown in FIG. 6) results in all light incident on the active area being incident at a point spaced from at least one of the unit sidewalls (and, thus, from the p-n junction) by not more than the predetermined acceptable distance of 1 to 2 mils.

The dramatic improvement in solar-cell performance resulting from correctly choosing the width of the active area is shown in FIG. 6 by superimposing a dotted-line plot B′ of short circuit-current response over the solid-line plot A′ previously discussed. More particularly, the vertical line at B in FIG. 6 illustrates a second junction location removed approximately 4 mils from the first junction location A. Extending between these two junctions at A and B is an active area indicated by legend in FIG. 6. This configuration of two p-n junctions separated by an active area of approximately 4 mils is, of course, the configuration of one embodiment of the instant invention discussed above. The dotted-line plot B′ of $I_{sc}$ shown in FIG. 6 is merely the same plot illustrated as a solid plot A′ in FIG. 6 but the dotted line plot is reversed to correspond with the existence of a p-n junction at location B. The relationship of these two plots of $I_{sc}$ can be readily understood by reference to horizontal axis II illustrated in FIG. 6 which shows $I_{sc}$ as a function of the position of the light spot in mils from a junction location. The numerical legend for curve A′ is labeled curve A′ on horizontal axis II while the numerical legend for curve B′ is labeled curve B′ on horizontal axis II.

The combination of curves A′ and B′ in FIG. 6 dramatically illustrates the improvement in solar-cell performance resulting from choosing the width of the active area to be equal to 4 mils. An active area of this width ensures that all light incident on the active area is incident at a point adjacent to but offset from the junction location, whereby the probability of carrier collection is markedly improved. It is, of course, apparent that the width of the active area could vary in accordance with the instant invention and then the positional relationship between curves A′ and B′ would change in response thereto. Also, curves A′ and B′ do not illustrate how $I_{sc}$ increases near the respective p-n junctions.

Assuming $W_1$ equal to 4.0 mils, it is of interest to assign approximate numbers to the remaining dimensions in FIG. 5 in order to calculate the dramatic increase in active area achieved through use of the narrow-groove fabrication technique. More particularly, let $W_2$ equal 0.1 mil and $W_4$ equal 0.5 mils, $W_3$ is then, of course, equal to 3.9 mils. With these assigned values, it is readily calculated that the percentage reduction in active area due to the narrow-groove fabrication technique is equal to $(0.1/3.9)\times 100$ or 2.55% while the percentage reduction in active area resulting from etching the wide groove completely through the substrate is equal to $(0.5/3.9)\times 100$ or 12.8%. The narrow-groove fabrication technique results in a dramatic improvement in increasing the active area of each unit solar cell.

In conclusion, solar cell performance is improved by constructing solar cells which differ markedly from prior-art solar cells in two ways. First, the "dead space" region is drastically reduced by forming a first large groove from the lower surface of the cell and a second very narrow groove from the upper surface of the cell. Second, the active area of each cell is advantageously chosen to be between 2 and 4 mils such that all light incident on the active area is incident at a point spaced from at least one of the unit sidewalls by not more than a predetermined distance. These two techniques result in improved cell performance without requiring the use of special unit-focusing lenses.

Figure 7:
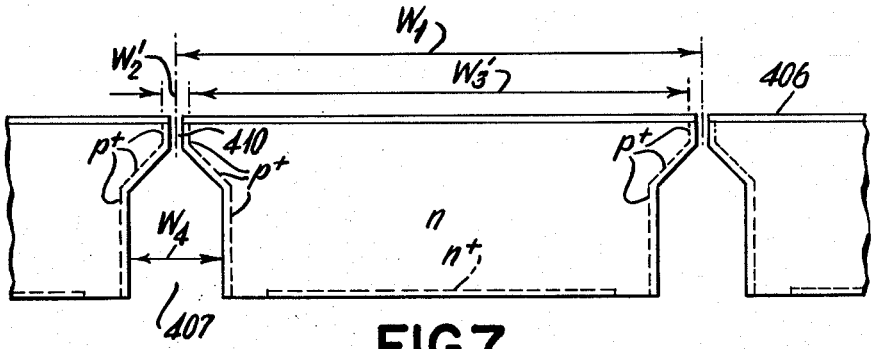
FIG. 7 is a view similar to FIG. 5 to show a modification.

FIG. 7 will be recognized as being structurally the same as FIG. 5, except for the fact that the p-n junctions are no longer buried. Thus, in FIG. 7, the two groove regions 410 and 407 will have been fully etched and defined prior to diffusion to form the p+ regions which now extend all the way to the antireflection coating at the exposure surface of the substrate. Preferably, the diffusion step is of short duration, whereby the p-n junction is relatively close to the surface of the groove wall. For example, for silicon substrate, a p-n junction plane suitable for high-intensity exposure may be established about 0.1 mil beneath the treated groove surface; and if a metal coating (e.g., electroless nickel) is applied, the p+ region may be even more shallow, approaching 0.01 mil.

Thus, in FIG. 7, at the exposure surface, the p-n junction will be exposed at each sidewall of the narrow grooves 410, thereby reducing the usefully effective exposure area of each cell unit, as suggested by the slightly reduced "active-area" designation $W_3'$ and by the slightly enlarged "dead space" designation $W_2'$ in the legends of FIG. 7. Nevertheless, for the case of p-n junctions formed at such shallow depth in the substrate material, the performance loss compared to the buried-junction configuration of FIGS. 4 and 5 can be small and, indeed, relatively unimportant. Certainly, manufacture is simplified by performing the etching steps prior to the p+ diffusion, and the operational improvement over the configuration of FIG. 1 is still so substantial as to enable direct exposure to high-intensity light without requiring a special unit-lens configuration as in said Ser. No. 690,056.

Figure 9:
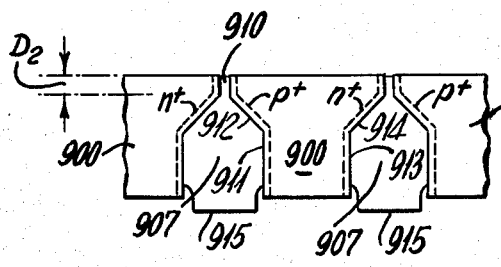
FIGS. 8 and 9 are views similar to FIG. 4 to show further modifications.
Figure 8:
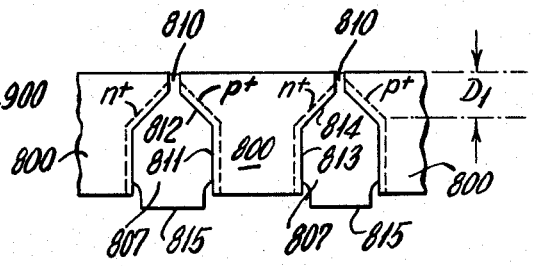

FIGS. 8 and 9 depict further modification of the invention, such modification being illustrated in application to "buried" p-n junctions in FIG. 8, and in application to "non-buried" p-n junctions in FIG. 9. The advantage of these embodiments lies in the vastly simplified problem of series-connecting adjacent cell units 800 (900), arising from the fact that p-n junctions are produced by p+ diffusion to one sidewall only 811–812 (911–912) for each successive groove 807 (907); similarly, n+ regions are formed only in the other sidewall 813–814 (913–914), for each successive groove 807 (907). In FIG. 8, the indicated p+ and n+ regions terminate short of the radiation-exposure surface of the solar-cell array, p-n junctions being thus buried beneath said surface; and in FIG. 9, the p+ and n+ regions extend to the exposure surface, but the number of p-n junctions at the exposure surface is one half the number which characterizes the embodiment of FIG. 7. Series-connection of adjacent cell units is schematically indicated by conductors 815 (915), but it will be understood that various specific techniques may be adopted for such connection, depending upon specific application of the resulting cell array. For example, entire grooves 807 (907) may be filled with electrically conductive material such as metal; alternatively, only the confined regions near the exposure surface may be filled, as in groove 810 to the depth $D_1$ in FIG. 8, or in groove 910 to the depth $D_2$ in FIG. 9, thus leaving the substantial included volume of the wider groove regions 807 (907) within which to accommodate flow of heat-exchanging liquid; to serve the dual purpose of extracting useful heat and cooling the array, while also extracting its electrical output. Still further, the adjacent cell units 800 (900) may fixedly be retained by glass, quartz or other transparent plate means, bonded to front or back surfaces of these units, with interconnect means carried by one such plate, thereby leaving unfilled grooves for particular purposes, such as cooling.

To produce the p+-n+ characterized groove-wall configurations of FIGS. 8 and 9, groove etching may proceed as above described, but to slightly more narrow groove-width proportions than is ultimately to apply in the finished array. A p+ diffusion may then be applied to both walls of all grooves, one of the walls being thereafter cut to establish the ultimate groove width, by localized etching to expose bare silicon. One way to accomplish this result is to oxidize all groove walls after making the p+ diffusion, and by then using a more narrowly slotted (and slightly laterally-offset positioned) mask for localized anisotropic etching behind the oxide coating of one wall, using a material (e.g., hydrazine) which will not attack the oxide coating of the other wall; the p+ diffusion on said other wall is still protected by its oxide coating, so that an n+ diffusion will only be operative on the bare-silicon wall, whereupon the oxide coating on the p+ diffusion wall can be removed.

While the invention has been described in detail for preferred forms shown, it will be understood that modifications may be made without departing from the scope of the invention. For example, the FIGS. 8–9 succession of p+-n+ characterized groove walls may be readily applied to alternate walls whatever the groove configuration, whether straight-walled as in FIG. 1, or otherwise as in said Ser. No. 689,989. Also, when using the same materials in FIG. 8 (and FIG. 9) as those discussed in connection with FIGS. 4 and 5, it should be noted that unit-cell width may be less than in connection with FIGS. 4 and 5, in recognition of the fact (shown in FIG. 6) that incident light should strike the exposure surface of each cell unit within 1 to 3 mils (i.e., approximately 2±1 mils) of the nearby p-n junction.

What is claimed is:

1. A semiconductor solar-cell array comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls, and having therebetween an upper surface adapted for exposure to receive incident radiation and a lower surface, adjacent sidewalls of adjacent units having therebetween a first space portion extending from the lower surface to a point close to but short of the upper surface and a second substantially smaller space portion, connected to the first space portion and extending from said point to the upper surface, at least one sidewall of each unit including a localized region of a second conductivity type, and ohmic connections extending between the second conductivity type region of one unit and a first conductivity type region of an adjacent unit.

2. The semiconductor solar-cell array of claim 1, wherein said localized region of a second conductivity type extends along said at least one sidewall, said region being beneath and substantially to said point, whereby said second conductivity-type region is buried beneath the upper surface.

3. The semiconductor solar-cell array of claim 2, wherein the distance between adjacent sidewalls of adjacent units at said point is substantially less than the distance between opposite sidewalls of an individual unit.

4. The semiconductor solar-cell array of claim 3, wherein the distance between adjacent sidewalls of adjacent units at the lower surface of each unit is substantially greater than the distance between adjacent sidewalls of adjacent units at said point.

5. The semiconductor solar-cell array of claim 4, wherein said upper surface extending between the opposite sidewalls of an individual unit separates the sidewalls by a fixed distance, said fixed distance being limited to twice a predetermined optimum distance whereby radiation incident at any point on said upper surface is incident at a point spaced from at least one of the unit sidewalls by not more than said predetermined optimum distance.

6. The semiconductor solar-cell array of claim 5, wherein the maximum of said predetermined optimum distance is about 2 mils.

7. The semiconductor solar-cell array of claim 1, wherein said localized region of a second conductivity type extends along at least a portion of each sidewall of each unit, said region being beneath and substantially to said point, whereby said second conductivity-type regions are buried beneath the upper surface.

8. A semiconductor solar-cell array comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls, and having therebetween an upper surface adapted for exposure to receive incident radiation and a lower surface, adjacent sidewalls of adjacent units being more closely spaced at juncture with said upper surface than their spacing at juncture with said lower surface, at least one sidewall of each unit including a region of a second conductivity type, and ohmic connections extending between the second conductivity-type region of one unit and a first conductivity-type region of an adjacent unit.

9. The solar-cell array of claim 8, in which the other sidewall of each unit includes a second region of higher impurity concentration in the first conductivity-type material, said ohmic connections to first conductivity-type regions being to said second regions.

10. The solar-cell array of claim 8, wherein for each unit said region of a second conductivity type extends upwardly to a point close to but short of said upper surface, whereby the junction between said second conductivity-type region and said first conductivity-type material is buried beneath the upper surface of said cell.

11. The solar-cell array of claim 8, wherein for each unit said region of a second conductivity-type extends upwardly to substantially said upper surface, and wherein (a) said second conductivity-type region is of such shallow depth in said first conductivity-type material and (b) the inter-unit spacing at the upper surface is so small compared to the upper-surface unit span between adjacent spaces that the total included upper-surface [are] comprehended by said spaced plural units is substantially entirely characterized by said first conductivity type.

12. The solar-cell array of claim 10 or claim 11, wherein both sidewalls of each unit have similar second conductivity-type regions.

13. The solar-cell array of claim 8, in which adjacent sidewalls of adjacent units are characterized by convergent slopes close to but offset from the upper surface, each of said slopes being so inclined as to laterally reflect incident radiation which is substantially normal to and penetrates the upper surface to the associated sidewall slope.

14. The solar-cell array of claim 13, in which each said slope has a coating of reflection-enhancing material.

15. A semiconductor solar-cell array comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls, and having therebetween an upper surface adapted for exposure to receive incident radiation and a lower surface, adjacent sidewalls of adjacent units being more closely spaced at juncture with said upper surface than their spacing at junction with said lower surface, corresponding first sidewalls of said units each including a region of a second conductivity type at least at a point close to but short of the upper surface, corresponding second sidewalls of said units including a region of said first conductivity type at least at a point in opposed adjacency to said second conductivity-type point, and an ohmic connection between said first and second conductivity-type points at each inter-unit space.

16. The solar-cell array of claim 15, in which each said ohmic connection is a metal filling which effectively closes the inter-unit space.

17. The solar-cell array of claim 15, in which each said ohmic connection is a metal filling essentially limited to the narrower region of each inter-unit space, the wider region of each inter-unit space being unfilled and therefore establishing a passage for conduct of a flow of heat-exchange liquid.

18. A semiconductor solar cell comprising a plurality of spaced, elongate, parallel units formed from a common substrate, the body material of each of said units being comprised of a first conductivity type and having the same spaced relation to the body material of other of said units as in the original substrate from which they are formed, each unit having spaced, elongate sidewalls and adjacent sidewalls of adjacent units having therebetween a dead-space area comprised of an upper portion and a lower portion, said upper portion of the dead-space area being substantially narrower than said lower portion of the dead-space area, each sidewall of each unit containing a region of a second conductivity type, and connection means including a conductive element having ohmic contact with said second conductivity type region of one unit and ohmic contact with a first conductivity type region of an adjacent unit.

19. The semiconductor solar cell of claim 18, wherein the upper portion of the dead-space area is bounded by a first pair of spaced parallel unit sidewalls separated from each other by a first distance and the lower portion of the dead-space area is bounded by a second pair of spaced parallel unit sidewalls separated from each other by a second distance, said second distance being substantially greater than said first distance.

20. The semiconductor solar cell of claim 19, wherein the dead-space area contains an intermediate portion lying between said upper and lower portions, said intermediate portion being bounded by a third pair of non-parallel spaced unit sidewalls, and said non-parallel spaced sidewalls being divergent in the direction of said lower portion of the dead-space area.

21. The semiconductor solar cell of claim 19, wherein the opposite sidewalls of each unit are spaced a fixed distance from each other by an elongate upper surface extending between the opposite sidewalls, said upper surface being adapted for exposure to receive incident radiation and said fixed distance being substantially greater than said first distance separating the spaced, parallel sidewalls of the upper portion of the dead-space area.

22. The semiconductor solar cell of claim 21, wherein said fixed distance is limited to twice a predetermined optimum distance, whereby radiation incident at any point on the upper surface is incident at a point spaced from at least one of the unit sidewalls by not more than said predetermined optimum distance.

23. The semiconductor solar cell of claim 22, wherein the maximum of said predetermined optimum distance is about 2 mils.

24. A semiconductor solar cell, comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls wherein upper edges of the sidewalls of each unit are spaced a first fixed distance from each other by an elongate upper surface extending between the upper edges of the sidewalls and wherein lower edges of the sidewalls are spaced a second fixed distance from each other by an elongate lower surface extending between the lower edges of the sidewalls, said first fixed distance being greater than said second fixed distance, said upper surface being adapted for exposure to receive incident radiation, and said first fixed distance being limited to twice a predetermined optimum distance, whereby radiation incident at any point on said upper surface is incident at a point spaced from at least one of the unit sidewalls by no more than said predetermined optimum distance, each unit further comprising a region of a second conductivity type in at least one of the sidewalls of each unit, and separate conductive connections establishing ohmic contact between the second conductivity type region of one unit and the first conductivity type region of another unit.

25. The semiconductor solar cell of claim 24, wherein adjacent sidewalls of adjacent units are separated by a first space portion extending from the lower edges of the sidewalls to a predetermined point close to but short of the upper edges of the sidewalls and by a second substantially smaller space portion connected to said first space portion and extending from the predetermined point to the upper edges of the sidewalls.

26. The semiconductor solar cell of claim 25, wherein said second conductivity type region in the unit sidewalls extends from the lower edges of the sidewalls, to the predetermined point, whereby said second conductivity type region is buried beneath the upper surface of the spaced units.

27. The semiconductor solar cell of claim 24, wherein the maximum of said predetermined optimum distance is about 2 mils.

28. A semiconductor solar cell comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls and having therebetween an upper surface adapted for exposure to receive incident radiation and a lower surface, said upstanding sidewalls being arranged to provide between the adjacent upper surfaces of adjacent units a space which is substantially smaller than the corresponding space between the adjacent lower surfaces of the adjacent units, each unit further comprising a region of a second conductivity type in at least one sidewall of each unit, and separate conductive connections establishing ohmic contact between the second conductivity-type region of one unit and the first conductivity-type region of another unit.

29. The semiconductor solar cell of claim 28, wherein said upper surface extending between the opposite sidewalls of an individual unit separates said sidewalls by a fixed distance, said fixed distance being limited to twice a predetermined optimum distance, whereby radiation incident at any point on said upper surface is incident at a point spaced from at least one of the unit sidewalls by not more than said predetermined optimum distance.

30. The semiconductor solar cell of claim 29, wherein the maximum of said predetermined optimum distance is about 2 mils.

31. A semiconductor solar cell, comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls and having therebetween an upper surface adapted for exposure to receive incident radiation and a lower surface, each unit sidewall comprised of a localized region of a second conductivity type, said second conductivity type region extending along the sidewall from said lower surface to a point close to but short of said upper surface, whereby said second conductivity type region is buried beneath the upper surface, and ohmic connections extending beneath said second conductivity type region of one unit and said first conductivity type region of an adjacent unit.

*32. A semiconductor solar-cell array comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls, and having therebetween an upper surface adapted for exposure to receive incident radiation and a lower surface, adjacent sidewalls of adjacent units having therebetween a first space portion extending from the lower surface to a point close to but short of the upper surface and a second substantially smaller space portion, connected to the first space portion and extending from said point to the upper surface, at least one sidewall of each unit including a localized region of a second conductivity type, and means interconnecting said units for combining the individual electrical outputs of said units, said means comprising separate conductive connections establishing ohmic contact with the respective sidewall regions of said units.*

*33. A semiconductor solar-cell array comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls, and having therebetween an upper surface adapted for exposure to receive incident radiation and a lower surface, adjacent sidewalls of adjacent units being more closely spaced at juncture with said upper surface than their spacing at juncture with said lower surface, at least one sidewall of each unit including a region of a second conductivity type, and means interconnecting said units for combining the individual electrical outputs of said units, said means comprising separate conductive connections establishing ohmic contact with the respective sidewall regions of said units.*

*34. A semiconductor solar-cell comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls, and having therebetween an upper surface adapted for exposure to receive incident radiation and a lower surface, adjacent sidewalls of adjacent units being more closely spaced at juncture with said upper surface than their spacing at junction with said lower surface, corresponding first sidewalls of said units each including a region of a second conductivity type at least at a point close to but short of the upper surface, corresponding second sidewalls of said units each including a region of said first conductivity type at least at a point in opposed adjacency to said second conductivity-type point, and means interconnecting said units for combining the individual electrical outputs of said units, said means comprising separate conductive connections establishing ohmic contact with the respective sidewall regions of said units.*

*35. A semiconductor solar cell comprising a plurality of spaced, elongate, parallel units formed from a common substrate, the body material of each of said units being comprised of a first conductivity type and having the same spaced relation to the body material of other of said units as in the original substrate from which they are formed, each unit having spaced, elongate sidewalls and adjacent sidewalls of adjacent units having therebetween a dead-space area comprised of an upper portion and a lower portion, said upper portion of the dead-space area being substantially narrower than said lower portion of the dead-space area, each sidewall of each unit containing a region of a second conductivity type, and means interconnecting said units for combining the individual electrical outputs of said units, said means comprising separate conductive connections establishing ohmic contact with the respective sidewall regions of said units.*

*36. A semiconductor solar cell, comprising a plurality of spaced, elongate, parallel units formed from a common substrate, the body material of each of said units being comprised of a first conductivity type and having the same*

*spaced relation to the body material of other of said units as in the original substrate from which they are formed, each unit having upstanding sidewalls wherein upper edges of the sidewalls of each unit are spaced a first fixed distance from each other by an elongate upper surface extending between the upper edges of the sidewalls and wherein lower edges of the sidewalls are spaced a second fixed distance from each other by an elongate lower surface extending between the lower edges of the sidewalls, said first fixed distance being greater than said second fixed distance, said upper surface being adapted for exposure to receive incident radiation, and said first fixed distance being limited to twice a predetermined optimum distance, whereby radiation incident at any point on said upper surface is incident at a point spaced from at least one of the unit sidewalls by no more than said predetermined optimum distance, each unit further comprising a region of a second conductivity type in at least one of the sidewalls of each unit, and means interconnecting said units for combining the individual electrical outputs of said units, said means comprising separate conductive connections establishing ohmic contact with the respective sidewall regions of said units.*

*37. A semiconductor solar cell comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls and having therebetween an upper surface adapted for exposure to receive incident radiation and a lower surface, said upstanding sidewalls being arranged to provide between the adjacent upper surfaces of adjacent units a space which is substantially smaller than the corresponding space between the adjacent lower surfaces of the adjacent units, each unit further comprising a region of a second conductivity type in at least one sidewall of each unit, and means interconnecting said units for combining the individual electrical outputs of said units, said means comprising separate conductive connections establishing ohmic contact with the respective sidewall regions of said units.*

*38. A semiconductor solar cell, comprising a plurality of spaced, elongate, parallel units formed from a common substrate, the body material of each of said units being comprised of a first conductivity type and having the same spaced relation to the body material of other of said units as in the original substrate from which they are formed, each unit having upstanding sidewalls and having therebetween an upper surface adapted for exposure to receive incident radiation and a lower surface, each unit sidewall comprised of a localized region of a second conductivity type, said second conductivity type region extending along the sidewall from said lower surface to a point close to but short of said upper surface, whereby said second conductivity type region is buried beneath the upper surface, and means interconnecting said units for combining the individual electrical outputs of said units, said means comprising separate conductive connections establishing ohmic contact with the respective sidewall regions of said units.*

* * * * *